(12) United States Patent
Torardi et al.

(10) Patent No.: US 9,039,942 B2
(45) Date of Patent: May 26, 2015

(54) LEAD-FREE CONDUCTIVE PASTE COMPOSITION AND SEMICONDUCTOR DEVICES MADE THEREWITH

(75) Inventors: Carmine Torardi, Wilmington, DE (US); Paul Douglas Vernooy, Hockessin, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 519 days.

(21) Appl. No.: 13/332,629

(22) Filed: Dec. 21, 2011

(65) Prior Publication Data
US 2013/0161573 A1    Jun. 27, 2013

(51) Int. Cl.
*H01B 1/02* (2006.01)
*H01B 1/22* (2006.01)
*H01L 31/0224* (2006.01)

(52) U.S. Cl.
CPC .......... *H01L 31/022425* (2013.01); *H01B 1/22* (2013.01); *Y02E 10/50* (2013.01)

(58) Field of Classification Search
CPC .......................... H01L 31/022425; C03C 3/04
USPC ............ 252/182.1, 514; 219/203; 501/77, 78; 136/256; 428/432; 362/253
See application file for complete search history.

(56) References Cited

U.S. PATENT DOCUMENTS

| 5,378,408 | A | * | 1/1995 | Carroll et al. | 252/514 |
| 6,255,239 | B1 | * | 7/2001 | Sakoske | 501/77 |
| 7,161,117 | B2 | * | 1/2007 | Minowa et al. | 219/203 |
| 7,494,607 | B2 | | 2/2009 | Wang et al. | |
| 2004/0214016 | A1 | * | 10/2004 | Adachi | 428/432 |
| 2006/0272700 | A1 | | 12/2006 | Young et al. | |
| 2009/0042715 | A1 | * | 2/2009 | Uchiyama et al. | 501/78 |
| 2010/0208462 | A1 | * | 8/2010 | Wu | 362/253 |
| 2010/0243048 | A1 | * | 9/2010 | Laudisio et al. | 136/256 |
| 2011/0278507 | A1 | * | 11/2011 | Cartagena et al. | 252/514 |

FOREIGN PATENT DOCUMENTS

WO    2010123967 A2    10/2010

* cited by examiner

*Primary Examiner* — Khanh Tuan Nguyen

(57) ABSTRACT

A lead-free conductive paste composition contains a source of an electrically conductive metal, a fusible material, an optional additive, and an organic vehicle. An article such as a high-efficiency photovoltaic cell is formed by a process of deposition of the lead-free paste composition on a semiconductor substrate (e.g., by screen printing) and firing the paste to remove the organic vehicle and sinter the metal and fusible material.

14 Claims, 1 Drawing Sheet

US 9,039,942 B2

LEAD-FREE CONDUCTIVE PASTE COMPOSITION AND SEMICONDUCTOR DEVICES MADE THEREWITH

FIELD OF THE INVENTION

The present invention relates to a conductive paste composition that is useful in the construction of a variety of electrical and electronic devices, and more particularly to a lead-free paste composition useful in creating conductive structures, including front-side electrodes for photovoltaic devices.

TECHNICAL BACKGROUND OF THE INVENTION

A conventional photovoltaic cell incorporates a semiconductor structure with a junction, such as a p-n junction formed with an n-type semiconductor and a p-type semiconductor. For the typical p-base configuration, a negative electrode is located on the side of the cell that is to be exposed to a light source (the "front" side, which in the case of a solar cell is the side exposed to sunlight), and a positive electrode is located on the other side of the cell (the "back" side). Radiation of an appropriate wavelength, such as sunlight, falling on the p-n junction serves as a source of external energy that generates electron-hole pair charge carriers. These electron-hole pair charge carriers migrate in the electric field generated by the p-n junction and are collected by electrodes on respective surfaces of the semiconductor. The cell is thus adapted to supply electric current to an electrical load connected to the electrodes, thereby providing electrical energy converted from the incoming solar energy that can do useful work. Solar-powered photovoltaic systems are considered to be environmentally beneficial in that they reduce the need for fossil fuels used in conventional electric power plants.

Industrial photovoltaic cells are commonly provided in the form of a structure, such as one based on a doped crystalline silicon wafer, that has been metalized, i.e., provided with electrodes in the form of electrically conductive metal contacts through which the generated current can flow to an external electrical circuit load. Most commonly, these electrodes are provided on opposite sides of a generally planar cell structure. Conventionally, they are produced by applying suitable conductive metal pastes to the respective surfaces of the semiconductor body and thereafter firing the pastes.

Photovoltaic cells are commonly fabricated with an insulating layer on their front side to afford an anti-reflective property that maximizes the utilization of incident light. However, in this configuration, the insulating layer normally must be removed to allow an overlaid front-side electrode to make contact with the underlying semiconductor surface. The front-side conductive metal paste typically includes a glass frit and a conductive species (e.g., silver particles) carried in an organic medium that functions as a vehicle. The electrode may be formed by depositing the paste composition in a suitable pattern (for instance, by screen printing) and thereafter firing the paste composition and substrate to dissolve or otherwise penetrate the insulating layer and sinter the metal powder, such that an electrical connection with the semiconductor structure is formed.

The ability of the paste composition to penetrate the anti-reflective coating and form a strong bond with the substrate upon firing is highly dependent on the composition of the conductive paste and the firing conditions. Efficiency, a key measure of photovoltaic cell performance, is also influenced by the quality of the electrical contact made between the fired conductive paste and the substrate.

Although various methods and compositions useful in forming devices such as photovoltaic cells are known, there nevertheless remains a need for compositions that permit fabrication of patterned conductive structures that provide improved overall device electrical performance and that facilitate the efficient manufacture of such devices.

SUMMARY OF THE INVENTION

An embodiment of the invention relates to a paste composition comprising in admixture: (a) a source of electrically conductive metal; (b) a fusible material comprising: 50-90 wt. % $Bi_2O_3$, 6.5-15 wt. % $Al_2O_3$, 2-26 wt. % $SiO_2$, and 0-9 wt. % $B_2O_3$, the weight percentages being based on the total fusible material, and wherein some or all of at least one of the oxides is optionally replaced by a fluoride of the same cation in an amount such that the fusible material comprises at most 5 wt. % of fluorine, based on the total fusible material; and (c) an organic vehicle; and wherein the paste composition is lead-free.

Another aspect provides a process for forming an electrically conductive structure on a substrate, the process comprising:
 (a) providing a substrate having a first major surface;
 (b) applying a paste composition onto a preselected portion of the first major surface, wherein the paste composition comprises in admixture:
  i) a source of electrically conductive metal;
  ii) at least one fusible material comprising:
   50-90 wt. % $Bi_2O_3$,
   6.5-15 wt. % $Al_2O_3$,
   2-26 wt. % $SiO_2$, and
   0-9 wt. % $B_2O_3$,
   the weight percentages being based on the total fusible material, and wherein some or all of at least one of the oxides is optionally replaced by a fluoride of the same cation in an amount such that the fusible material comprises at most 5 wt. % of fluorine, based on the total fusible material; and
  iii) an organic vehicle,
  wherein the paste composition is lead-free; and
 (c) firing the substrate and paste composition thereon, whereby the electrically conductive structure is formed on the substrate.

Further, there is provided an article comprising a substrate and an electrically conductive structure thereon, the article having been formed by the foregoing process. Representative articles of this type include a semiconductor device and a photovoltaic cell. In an embodiment, the substrate comprises a silicon wafer.

BRIEF DESCRIPTION OF THE DRAWINGS

The invention will be more fully understood and further advantages will become apparent when reference is made to the following detailed description of the preferred embodiments of the invention and the accompanying drawings, wherein like reference numerals denote similar elements throughout the several views and in which.

DETAILED DESCRIPTION OF THE INVENTION

Figure 1A:
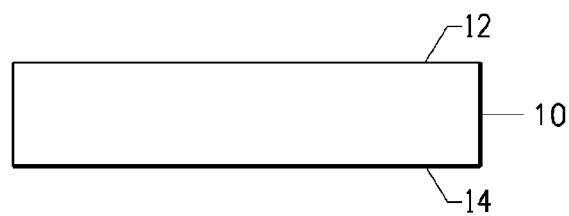
FIGS. 1A-1F depict successive steps of a process by which a semiconductor device may be fabricated. The device in turn may be incorporated into a photovoltaic cell. Reference numerals as used in FIGS. 1A-1F include the following:
 10: p-type substrate
 12: first major surface (front side) of substrate 10
 14: second major surface (back side) of substrate 10
 20: n-type diffusion layer 30: insulating layer
40: p+ layer
60: aluminum paste formed on back side
61: aluminum back electrode (obtained by firing back-side aluminum paste)
70: silver or silver/aluminum paste formed on back side
71: silver or silver/aluminum back electrode (obtained by firing back-side paste)
500: silver paste formed on front side according to the invention
501: silver front electrode according to the invention (formed by firing front-side silver paste)

The present invention addresses the need for a process to manufacture high performance semiconductor devices having mechanically robust, high conductivity electrodes. The conductive paste composition provided herein is beneficially employed in the fabrication of front-side electrodes of photovoltaic devices. Ideally, a paste composition promotes the formation of a relatively low resistance contact between the front-side metallization and the underlying semiconductor substrate. Suitable paste compositions are believed to aid in etching surface insulating layers often employed in semiconductor structures such as photovoltaic cells.

In an aspect, this invention provides a lead-free paste composition that comprises: a functional conductive component, such as a source of electrically conductive metal; a fusible material; and an organic vehicle.

The paste composition may comprise, in admixture, an inorganic solids portion comprising (a) about 75% to about 99.5% by weight, or about 85 to about 99% by weight, or about 95 to about 99% by weight, of a source of an electrically conductive metal; and (b) about 0.5% to about 10% by weight, or about 0.5% to about 8% by weight, or about 2% to about 8% by weight, or about 0.5 to about 5% by weight, or about 1 to about 3% by weight, of a fusible material, wherein the above stated contents of constituents (a) and (b) are based on the total weight of all the constituents of the inorganic solids portion of the composition.

As further described below, the paste composition also comprises an organic vehicle, which acts as a carrier for the inorganic constituents, which are dispersed therein. The paste composition may further include additional components such as surfactants, thickeners, thixotropes, and binders.

Typically, electrodes and other conductive traces are provided by screen printing the paste composition onto a substrate, although other forms of printing, such as plating, extrusion, inkjet, shaped or multiple printing, or ribbons may also be used. After deposition, the composition, which typically comprises a conductive metal powder (e.g., Ag) in an organic carrier, is fired at an elevated temperature.

The composition also can be used to form conductive traces, such as those employed in a semiconductor module that is to be incorporated into an electrical or electronic device. As would be recognized by a skilled artisan, the paste composition described herein can be termed "conductive," meaning that the composition can be formed into a structure and thereafter processed to exhibit an electrical conductivity sufficient for conducting electrical current between devices or circuitry connected thereto.

I. Inorganic Components

An embodiment of the present invention relates to a paste composition, which may include: an inorganic solids portion comprising a functional material providing electrical conductivity, a fusible material, and an organic vehicle in which the inorganic solids are dispersed. The paste composition may further include additional components such as surfactants, thickeners, thixotropes, and binders.

A. Electrically Conductive Metal

The present paste composition includes a source of an electrically conductive metal. Exemplary metals include without limitation silver, gold, copper, nickel, palladium, platinum, aluminum, and alloys and mixtures thereof. Silver is preferred for its processability and high conductivity.

The conductive metal may be incorporated directly in the present paste composition as a metal powder. In another embodiment, a mixture of two or more such metals is directly incorporated. Alternatively, the metal is supplied by a metal oxide or salt that decomposes upon exposure to the heat of firing to form the metal. As used herein, the term "silver" is to be understood as referring to elemental silver metal, alloys of silver, and mixtures thereof, and may further include silver derived from silver oxide ($Ag_2O$ or $AgO$) or silver salts such as $AgCl$, $AgNO_3$, $AgOOCCH_3$ (silver acetate), $AgOOCF_3$ (silver trifluoroacetate), $Ag_3PO_4$ (silver orthophosphate), or mixtures thereof. Any other form of conductive metal compatible with the other components of the paste composition also may be used.

Electrically conductive metal powder used in the present paste composition may be supplied as finely divided particles having any one or more of the following morphologies: a powder form, a flake form, a spherical form, a granular form, a nodular form, a crystalline form, other irregular forms, or mixtures thereof. The electrically conductive metal or source thereof may also be provided in a colloidal suspension, in which case the colloidal carrier would not be included in any calculation of weight percentages of the solids of which the colloidal material is part.

The particle size of the metal is not subject to any particular limitation. As used herein, "particle size" is intended to refer to "median particle size" or $d_{50}$, by which is meant the 50% volume distribution size. The distribution may also be characterized by $d_{90}$, meaning that 90% by volume of the particles are smaller than $d_{90}$. Volume distribution size may be determined by a number of methods understood by one of skill in the art, including but not limited to laser diffraction and dispersion methods employed by a Microtrac particle size analyzer (Montgomeryville, Pa.). Dynamic light scattering, e.g., using a model LA-910 particle size analyzer available commercially from Horiba Instruments Inc. (Irvine, Calif.), may also be used. In various embodiments, the median particle size is greater than 0.2 μm and less than 10 μm, or the median particle size is greater than 0.4 μm and less than 5 μm, as measured using the Horiba LA-910 analyzer.

The electrically conductive metal may comprise any of a variety of percentages of the composition of the paste composition. To attain high conductivity in a finished conductive structure, it is generally preferable to have the concentration of the electrically conductive metal be as high as possible while maintaining other required characteristics of the paste composition that relate to either processing or final use. In an embodiment, the silver or other electrically conductive metal may comprise about 75% to about 99% by weight, or about 85 to about 99% by weight, or about 95 to about 99% by weight, of the inorganic solid components of the paste composition. In another embodiment, the solids portion of the paste composition may include about 80 to about 90 wt. % silver particles and about 1 to about 9 wt. % silver flakes. In an embodiment, the solids portion of the paste composition may include about 70 to about 90 wt. %. silver particles and about 1 to about 9 wt. % silver flakes. In another embodiment, the solids portion of the paste composition may include about 70 to about 90 wt. % silver flakes and about 1 to about 9 wt. % of colloidal silver. In a further embodiment, the solids portion of the paste composition may include about 60 to about 90 wt. % of silver particles or silver flakes and about 0.1 to about 20 wt. % of colloidal silver.

The electrically conductive metal used herein, particularly when in powder form, may be coated or uncoated; for example, it may be at least partially coated with a surfactant to facilitate processing. Suitable coating surfactants include, for example, stearic acid, palmitic acid, a salt of stearate, a salt of palmitate, and mixtures thereof. Other surfactants that also may be utilized include lauric acid, oleic acid, capric acid, myristic acid, linoleic acid, and mixtures thereof. Still other surfactants that also may be utilized include polyethylene oxide, polyethylene glycol, benzotriazole, poly(ethylene glycol)acetic acid, and other similar organic molecules. Suitable counter-ions for use in a coating surfactant include without limitation hydrogen, ammonium, sodium, potassium, and mixtures thereof. When the electrically conductive metal is silver, it may be coated, for example, with a phosphorus-containing compound.

In an embodiment, one or more surfactants may be included in the organic vehicle in addition to any surfactant included as a coating of conductive metal powder used in the present paste composition.

As further described below, the electrically conductive metal can be dispersed in an organic vehicle that acts as a carrier for the metal phase and other constituents present in the formulation.

B. Fusible Material

The present paste composition includes a fusible material. The term "fusible," as used herein, refers to the ability of a material to become fluid upon heating, such as the heating employed in a firing operation. In some embodiments, the fusible material is composed of one or more fusible subcomponents. For example, the fusible material may comprise a glass material, or a mixture of two or more glass materials. Glass material in the form of a fine powder, e.g., as the result of a comminution operation, is often termed "frit" and is readily incorporated in the present paste composition.

As used herein, the term "glass" refers to a particulate form of solid oxide or oxyfluoride that is at least predominantly amorphous, meaning that short-range atomic order is preserved in the immediate vicinity of any selected atom, that is, in the first coordination shell, but dissipates at greater atomic-level distances (i.e., there is no long range periodic order). Hence, the X-ray diffraction pattern of a fully amorphous material exhibits broad diffuse peaks, and not the well-defined, narrow peaks of a crystalline material. In the latter, the regular spacing of characteristic crystallographic planes give rise to the peaks, whose position in reciprocal space is in accordance with Bragg's law. A glass material also does not show a substantial crystallization exotherm upon heating close to or above its glass transition temperature or softening point, $T_g$, which is defined as the second transition point seen in a differential thermal analysis (DTA) scan. In an embodiment, the softening point of glass material used in the present paste composition is in the range of 300 to 800° C.

It is also contemplated that some or all of the fusible material may be composed of material that exhibits some degree of crystallinity. For example, in some embodiments, a plurality of oxides are melted together and quenched as set forth above, resulting in a material that is partially amorphous and partially crystalline. As would be recognized by a skilled person, such a material would produce an X-ray diffraction pattern having narrow, crystalline peaks superimposed on a pattern with broad amorphous peaks. Alternatively, one or more constituents, or even substantially all of the fusible material, may be predominantly or even substantially fully crystalline. In an embodiment, crystalline material useful in the fusible material of the present paste composition may have a melting point of at most 800° C.

The present fusible material is described herein as including percentages of certain components (also termed the elemental constituency). Specifically, the composition may be specified by denominating individual components that may be combined in the specified percentages to form a starting material that subsequently is processed, e.g., as described herein, to form a glass or other fusible material. Such nomenclature is conventional to one of skill in the art. In other words, the composition contains certain components, and the percentages of those components are expressed as percentages of the corresponding oxide or other forms. As recognized by one of ordinary skill in the art of glass chemistry, a certain portion of volatile species may be released during the process of making the fusible material. An example of a volatile species is oxygen. The skilled person would also recognize that a fusible material composition specified in this manner may alternatively be prepared by supplying the required anions and cations in requisite amounts from different components that, when mixed, yield the same overall composition. For example, in various embodiments, phosphorus could be supplied either from $P_2O_5$ or alternatively from a phosphate of one of the cations of the composition.

Although oxygen is typically the predominant anion in the fusible material of the present paste composition, some portion of the oxygen may be replaced by fluorine to alter certain properties, such as chemical, thermal, or rheological properties of the glass that affect firing. One of ordinary skill would recognize that embodiments wherein the glass composition contains fluorine can be prepared using fluoride anions supplied from a simple fluoride or an oxyfluoride. For example, the desired fluorine content can be supplied by replacing some or all of an oxide nominally specified in the composition with the corresponding fluoride of the same cation, such as by replacing some or all of the $Li_2O$, $Na_2O$, or $Bi_2O_3$ nominally included with the amount of LiF, NaF, or $BiF_3$ needed to attain the desired level of F content. Of course, the requisite amount of F can be derived by replacing the oxides of more than one of the fusible material's cations if desired. Other fluoride sources could also be used, including sources such as ammonium fluoride that would decompose during the heating in typical glass preparation to leave behind residual fluoride anions. Useful fluorides include, but are not limited to, $BiF_3$, $AlF_3$, NaF, LiF, $ZrF_4$, $TiF_4$, and $ZnF_2$. Certain of the present paste compositions containing fluorides beneficially include Na and Li cations. Specifically, it has been found that if fluorine is present, the concomitant presence of Na and/or Li enhances device properties of photovoltaic cells having front-side electrodes made with such a paste composition. In an embodiment, the fusible material of the paste composition comprises 0-2 wt. % $Li_2O$, 0-3 wt. % $Na_2O$, and 0.5-4 wt. % F, with the proviso that the total amount of $Li_2O$ and $Na_2O$ is at least 0.5 wt. %.

It is known to those skilled in the art that a fusible material such as one prepared by a melting technique as described herein may be characterized by known analytical methods that include, but are not limited to: Inductively Coupled Plasma-Emission Spectroscopy (ICPES), Inductively Coupled Plasma-Atomic Emission Spectroscopy (ICP-AES), and the like. In addition, the following exemplary techniques may be used: X-Ray Fluorescence spectroscopy (XRF), Nuclear Magnetic Resonance spectroscopy (NMR), Electron Paramagnetic Resonance spectroscopy (EPR), Mössbauer spectroscopy, Electron microprobe Energy Dispersive Spectroscopy (EDS), Electron microprobe Wavelength Dispersive Spectroscopy (WDS), and Cathodoluminescence (CL). A skilled person could calculate percentages of starting components that could be processed to yield a particular fusible material, based on results obtained with such analytical methods.

The fusible materials described herein, including the glass compositions listed in Table I, are not limiting; it is contemplated that one of ordinary skill in the art of glass chemistry could make minor substitutions of additional ingredients and not substantially change the desired properties of the fusible material composition, including its interaction with a substrate and any insulating layer thereon.

A median particle size of the fusible material in the present composition may be in the range of about 0.5 to 10 μm, or about 0.8 to 5 μm, or about 1 to 3 μm, as measured using the Horiba LA-910 analyzer.

In an embodiment, the amount of fusible material in the paste composition may be in the range of 0.5 to 10 wt. %, 1 to 6 wt. %, 1 to 4 wt. %, 1.5 to 2.5 wt. %, or 2 to 5 wt. % of the paste composition. In various embodiments, the fusible material of the present paste composition comprises: (a) 50-90 wt. % $Bi_2O_3$, 6.5-15 wt. % $Al_2O_3$, 2-26 wt. % $SiO_2$, and 0-9 wt. % $B_2O_3$; or (b) 60-90 wt. % $Bi_2O_3$, 6.5-12.5 wt. % $Al_2O_3$, 2-19 wt. % $SiO_2$, and 0.5-7 wt. % $B_2O_3$, or (c) 70-90 wt. % $Bi_2O_3$, 6.5-10 wt. % $Al_2O_3$, 2-12 wt. % $SiO_2$, and 1-5 wt. % $B_2O_3$, wherein the weight percentages are based on the total fusible material. In either of these compositions, some or all of at least one of the oxides is optionally replaced by a fluoride of the same cation in an amount such that the fusible material comprises at most 5 wt. % of fluorine, based on the total fusible material. Either composition may also further comprise at least one of: 0-6 wt. % ZnO, 0-3 wt. % $P_2O_5$, 0-5 wt. % $Li_2O$, 0-5 wt. % $Na_2O$, 0-2 wt. % $TiO_2$, or 0-2 wt. % $ZrO_2$. In another embodiment, the fusible material consists essentially of 71-90 wt. % $Bi_2O_3$, 6.5-11 wt. % $Al_2O_3$, 2-13 wt. % $SiO_2$, and 1-5 wt. % $B_2O_3$; or 80-90 wt. % $Bi_2O_3$, 6.5-8 wt. % $Al_2O_3$, 2-8 wt. % $SiO_2$, and 1.5-4 wt. % $B_2O_3$.

In an embodiment, the fusible material may be produced by conventional glass making techniques and equipment. For the examples provided herein, the ingredients were weighed and mixed in the desired proportions and heated in a platinum alloy crucible in a furnace. The ingredients may be heated to a peak temperature (e.g., 800° C. to 1400° C., or 1000° C. to 1200° C.) and held for a time such that the material forms a melt that is substantially liquid and homogeneous (e.g., 20 minutes to 2 hours). The melt optionally is stirred, either intermittently or continuously. In an embodiment, the melting process results in a material wherein the constituent chemical elements are fully mixed at an atomic level. The molten material is then typically quenched in any suitable way including, without limitation, passing it between counter-rotating stainless steel rollers to form 0.25 to 0.50 mm thick platelets, by pouring it onto a thick stainless steel plate, or by pouring it into water or other quench fluid. The resulting particles are then milled to form a powder or frit.

Other production techniques may also be used for the present fusible material. One skilled in the art of producing such materials might therefore employ alternative synthesis techniques including, but not limited to, melting in non-precious metal crucibles, melting in ceramic crucibles, sol-gel, spray pyrolysis, or others appropriate for making powder forms of glass.

A skilled person would recognize that the choice of raw materials could unintentionally include impurities that may be incorporated into the fusible material during processing. For example, the impurities may be present in the range of hundreds to thousands of parts per million. Impurities commonly occurring in industrial materials used herein are known to one of ordinary skill.

The presence of the impurities would not substantially alter the properties of the fusible material itself, paste compositions made with the fusible material, or a fired device manufactured using the paste composition. For example, a solar cell employing a conductive structure made using the present paste composition may have the efficiency described herein, even if the composition includes impurities.

The fusible material used in the present composition is believed to assist in the partial or complete penetration of the oxide or nitride insulating layer commonly present on a silicon semiconductor wafer during firing. As described herein, this at least partial penetration may facilitate the formation of an effective, mechanically robust electrical contact between a conductive structure manufactured using the present composition and the underlying silicon semiconductor of a photovoltaic device structure.

In an embodiment, the present paste composition (including the fusible material contained therein) is lead-free. As used in the present specification and the subjoined claims, the term "lead-free" refers to a composition to which no lead has been specifically added (either as elemental lead or as a lead-containing alloy, compound, or other like substance), and in which the amount of lead present as a trace component or impurity is 1000 parts per million (ppm) or less. In some embodiments, the amount of lead present as a trace component or impurity is less than 500 parts per million (ppm), or less than 300 ppm, or less than 100 ppm. The minimization of lead in the present paste composition facilitates the disposal or recycling of devices constructed with the composition and mitigates the health hazard associated with the known toxicity of lead-bearing substances, such as the present composition. Surprisingly and unexpectedly, photovoltaic cells exhibiting desirable electrical properties, such as high conversion efficiency, are obtained in some embodiments of the present disclosure, notwithstanding previous belief in the art that substantial amounts of lead must be included in a paste composition to attain these levels.

In still another embodiment, the present paste composition is zinc-free. As used in the present specification and the subjoined claims, the term "zinc-free" refers to a composition to which no zinc has been specifically added (either as elemental zinc or as a zinc-containing alloy, compound, or other like substance), and in which the amount of zinc present as a trace component or impurity is 1000 parts per million (ppm) or less. Although zinc is frequently incorporated in glass compositions, in some instances the firing operation produces one or more zinc silicate compositions that are non-conductive and believed to be slightly deleterious to a photovoltaic cell's functional properties. In some embodiments, photovoltaic devices in which the present lead-free paste composition is used to form front-side electrodes attain electrical properties that are equivalent to, or better than, those of devices made with conventional leaded pastes. Those properties can, in some cases, be obtained without the Zn-based additives heretofore believed essential for known lead-free paste compositions.

The fusible material in the present paste composition may optionally comprise a plurality of separate fusible substances, such as one or more frits, or a substantially crystalline material with additional frit material. In an embodiment, a first fusible subcomponent is chosen for its capability to rapidly digest an insulating layer, such as that typically present on the front surface of a photovoltaic cell; further the first fusible subcomponent may have strong corrosive power and low viscosity. A second fusible subcomponent is optionally included to slowly blend with the first fusible subcomponent to alter the chemical activity. Preferably, the composition is such that the insulating layer is partially removed but without attacking the underlying emitter diffused region, which would shunt the device, were the corrosive action to proceed unchecked. Such fusible materials may be characterized as having a viscosity sufficiently high to provide a stable manufacturing window to remove insulating layers without damage to the diffused p-n junction region of a semiconductor substrate. Ideally, the firing process results in a substantially complete removal of the insulating layer without further combination with the underlying Si substrate or the formation of substantial amounts of non-conducting or poorly conducting inclusions.

C. Additive(s)

In some embodiments, the present paste composition separately includes at least one discrete additive that acts in concert with other paste constituents. The additive may play any of a number of roles by which the properties of a device produced using the paste are enhanced and/or the processing is facilitated. In an embodiment, the additive content of the present paste composition ranges from 0 to about 5 wt. %, based on the total weight of the paste composition.

In some embodiments, it is believed that during firing, the discrete additive acts in concert with the fusible material in the present paste composition to promote etching and rapid digestion of the insulating layer conventionally used on the front side of a photovoltaic cell. Efficient etching in turn permits the formation of a low resistance, front-side electrical contact between the metal(s) of the composition and the underlying substrate.

Other additives may act to promote doping of an emitter layer in a solar cell, to flux the fusible material during firing or otherwise enhance adhesion of the conductive structure, or to control the paste rheology, e.g., by acting as an inorganic thixotrope.

II. Organic Vehicle

The inorganic components of the present composition are typically mixed with an organic vehicle to form a relatively viscous material referred to as a "paste" or an "ink" that has a consistency and rheology that render it suitable for printing processes, including without limitation screen printing. The mixing is typically done with a mechanical system, and the constituents may be combined in any order, as long as they are uniformly dispersed and the final formulation has characteristics such that it can be successfully applied during end use.

A wide variety of inert viscous materials can be admixed in an organic medium in the present composition including, without limitation, an inert, non-aqueous liquid that may or may not contain thickeners or stabilizers. By "inert" is meant a material that may be removed by a firing operation without leaving any substantial residue or other adverse effect that is detrimental to final conductor line properties.

The proportions of organic vehicle and inorganic components in the present paste composition can vary in accordance with the method of applying the paste and the kind of organic vehicle used. In an embodiment, the present paste composition typically contains about 76 to 95 wt. %, or 85 to 95 wt. %, of the inorganic components and about 5 to 24 wt. %, or 5 to 15 wt. %, of the organic vehicle.

The organic vehicle typically provides a medium in which the inorganic components are dispersible with a good degree of stability. In particular, the composition preferably has a stability compatible not only with the requisite manufacturing, shipping, and storage, but also with conditions encountered during deposition, e.g. by a screen printing process. Ideally, the rheological properties of the vehicle are such that it lends good application properties to the composition, including stable and uniform dispersion of solids, appropriate viscosity and thixotropy for screen printing, appropriate wettability of the paste solids and the substrate on which printing will occur, a rapid drying rate after deposition, and stable firing properties.

Substances useful in the formulation of the organic vehicle of the present paste composition include, without limitation, ones disclosed in U.S. Pat. No. 7,494,607 and International Patent Application Publication No. WO 2010/123967 A2, both of which are incorporated herein in their entirety for all purposes, by reference thereto. The disclosed substances include ethylhydroxyethyl cellulose, wood rosin, mixtures of ethyl cellulose and phenolic resins, cellulose acetate, cellulose acetate butyrate, polymethacrylates of lower alcohols, monobutyl ether of ethylene glycol, monoacetate ester alcohols, and terpenes such as alpha- or beta-terpineol or mixtures thereof with other solvents such as kerosene, dibutylphthalate, butyl carbitol, butyl carbitol acetate, hexylene glycol and high-boiling alcohols and alcohol esters.

Solvents useful in the organic vehicle include, without limitation, ester alcohols and terpenes such as alpha- or beta-terpineol or mixtures thereof with other solvents such as kerosene, dibutylphthalate, butyl carbitol, butyl carbitol acetate, hexylene glycol, and high-boiling alcohols and alcohol esters. A preferred ester alcohol is the monoisobutyrate of 2,2,4-trimethyl-1,3-pentanediol, which is available commercially from Eastman Chemical (Kingsport, Tenn.) as TEXANOL™. Some embodiments may also incorporate volatile liquids in the organic vehicle to promote rapid hardening after application on the substrate. Various combinations of these and other solvents are formulated to provide the desired viscosity and volatility.

In an embodiment, the organic vehicle may include one or more components selected from the group consisting of: bis (2-(2butoxyethoxy)ethyl)adipate, dibasic esters, octyl epoxy tallate (DRAPEX® 4.4 from Witco Chemical), Oxocol (isotetradecanol made by Nissan Chemical) and FORALYN™ 110 (pentaerythritol ester of hydrogenated rosin from Eastman Chemical BV). The paste compositions may also include additional additives or components.

The dibasic ester useful in the present paste composition may comprise one or more dimethyl esters selected from the group consisting of dimethyl ester of adipic acid, dimethyl ester of glutaric acid, and dimethyl ester of succinic acid. Various forms of such materials containing different proportions of the dimethyl esters are available under the DBE® trade name from Invista (Wilmington, Del.). For the present paste composition, a preferred version is sold as DBE-3 and is said by the manufacturer to contain 85 to 95 weight percent dimethyl adipate, 5 to 15 weight percent dimethyl glutarate, and 0 to 1.0 weight percent dimethyl succinate based on total weight of dibasic ester.

Further ingredients optionally may be incorporated in the organic vehicle, such as thickeners, stabilizers, and/or other common additives known to those skilled in the art. The organic vehicle may be a solution of one or more polymers in a solvent. Additionally, effective amounts of additives, such as surfactants or wetting agents, may be a part of the organic vehicle. Such added surfactant may be included in the organic vehicle in addition to any surfactant included as a coating on the conductive metal powder of the paste composition. Suitable wetting agents include phosphate esters and soya lecithin. Both inorganic and organic thixotropes may also be present.

Among the commonly used organic thixotropic agents are hydrogenated castor oil and derivatives thereof, but other suitable agents may be used instead of, or in addition to, these substances. It is, of course, not always necessary to incorporate a thixotropic agent since the solvent and resin properties coupled with the shear thinning inherent in any suspension may alone be suitable in this regard.

A polymer frequently used in printable conductive metal pastes is ethyl cellulose. Other exemplary polymers that may be used include ethylhydroxyethyl cellulose, wood rosin and derivatives thereof, mixtures of ethyl cellulose and phenolic resins, cellulose acetate, cellulose acetate butyrate, poly (methacrylate)s of lower alcohols, and monoalkyl ethers of ethylene glycol monoacetate.

Any of these polymers may be dissolved in a suitable solvent, including those described herein.

The polymer in the organic vehicle may be present in the range of 0.1 wt. % to 5 wt. % of the total composition. The present paste composition may be adjusted to a predetermined, screen-printable viscosity, e.g., with additional solvent(s).

III. Formation of Conductive Structures

An aspect of the invention provides a process that may be used to form a conductive structure on a substrate. The process generally comprises the steps of providing the substrate, applying a paste composition, and firing the substrate. Ordinarily, the substrate is planar and relatively thin, thus defining first and second major surfaces on its opposite sides.

Application

The present composition can be applied as a paste onto a preselected portion of a major surface of the substrate in a variety of different configurations or patterns. The preselected portion may comprise any fraction of the total first major surface area, including substantially all of the area. In an embodiment, the paste is applied on a semiconductor substrate, which may be single-crystal, multi-crystal, poly-crystalline, or ribbon silicon, or any other semiconductor material.

The application can be accomplished by a variety of deposition processes, including printing. Exemplary deposition processes include, without limitation, plating, extrusion or co-extrusion, dispensing from a syringe, and screen, inkjet, shaped, multiple, and ribbon printing. The paste composition ordinarily is applied over any insulating layer present on the first major surface of the substrate.

The conductive composition may be printed in any useful pattern. For example, the electrode pattern used for the front side of a photovoltaic cell commonly includes a plurality of narrow grid lines or fingers connected to one or more bus bars. In an embodiment, the width of the lines of the conductive fingers may be 20 to 200 μm; 40 to 150 μm; or 60 to 100 μm. In an embodiment, the thickness of the lines of the conductive fingers may be 5 to 50 μm; 10 to 35 μm; or 15 to 30 μm. Such a pattern permits the generated current to be extracted without undue resistive loss, while minimizing the area of the front side obscured by the metallization, which reduces the amount of incoming light energy that can be converted to electrical energy. Ideally, the features of the electrode pattern should be well defined, with a preselected thickness and shape, and have high electrical conductivity and low contact resistance with the underlying structure.

Conductors formed by printing and firing a paste such as that provided herein are often denominated as "thick film" conductors, since they are ordinarily substantially thicker than traces formed by atomistic processes, such as those used in fabricating integrated circuits. For example, thick film conductors may have a thickness after firing of about 1 to 100 μm. Consequently, paste compositions that in their processed form provide conductivity and are suitably applied using printing processes are often called "thick film pastes" or "conductive inks."

Firing

A firing operation may be used in the present process to effect a substantially complete burnout of the organic vehicle from the deposited paste. The firing typically involves volatilization and/or pyrolysis of the organic materials. A drying operation optionally precedes the firing operation, and is carried out at a modest temperature to harden the paste composition by removing its most volatile organics.

The firing process is believed to remove the organic vehicle, sinter the conductive metal in the composition, and establish electrical contact between the semiconductor substrate and the fired conductive metal. Firing may be performed in an atmosphere composed of air, nitrogen, an inert gas, or an oxygen-containing mixture such as a mixed gas of oxygen and nitrogen.

In one embodiment, the temperature for the firing may be in the range between about 300° C. to about 1000° C., or about 300° C. to about 525° C., or about 300° C. to about 650° C., or about 650° C. to about 1000° C. The firing may be conducted using any suitable heat source. In an embodiment, the firing is accomplished by passing the substrate bearing the printed paste composition pattern through a belt furnace at high transport rates, for example between about 100 to about 500 cm per minute, with resulting hold-up times between about 0.05 to about 5 minutes. Multiple temperature zones may be used to control the desired thermal profile, and the number of zones may vary, for example, between 3 to 11 zones. The temperature of a firing operation conducted using a belt furnace is conventionally specified by the furnace set point in the hottest zone of the furnace, but it is known that the peak temperature attained by the passing substrate in such a process is somewhat lower than the highest set point. Other batch and continuous rapid fire furnace designs known to one of skill in the art are also contemplated.

The fired electrode may include components, compositions, and the like, resulting from the firing and sintering process. For example, in embodiments wherein the paste composition includes Zn-containing substances, the fired electrode may include zinc silicates, including but not limited to, willemite ($Zn_2SiO_4$) and $Zn_{1.7}SiO_{4-x}$ (in an embodiment, x may be 0.3). In a further embodiment the fired electrode may include bismuth silicates, including but not limited to $Bi_4(SiO_4)_3$ or $Bi_2SiO_5$.

In a further embodiment, other conductive and device enhancing materials are applied prior to firing to the opposite type region of the semiconductor device. The various materials may be applied and then co-fired, or they may be applied and fired sequentially.

In an embodiment, the opposite type region may be on the non-illuminated (back) side of the device, i.e., its second major surface. The materials serve as electrical contacts, passivating layers, and solderable tabbing areas. In an aspect of this embodiment, the back-side conductive material may contain aluminum. Exemplary back-side aluminum-containing compositions and methods of application are described, for example, in US 2006/0272700, which is hereby incorporated herein in its entirety for all purposes by reference thereto. Suitable solderable tabbing materials include those containing aluminum and silver. Exemplary tabbing compositions containing aluminum and silver are described, for example in US 2006/0231803, which is hereby incorporated herein in its entirety for all purposes by reference thereto.

In a further embodiment, the present paste composition may be employed in the construction of semiconductor devices wherein the p and n regions are formed side-by-side in a substrate, instead of being respectively adjacent to opposite major surfaces of the substrate. In an implementation in this configuration, the electrode-forming materials may be applied in different portions of a single side of the substrate, e.g., on the non-illuminated (back) side of the device, thereby maximizing the amount of light incident on the illuminated (front) side.

Insulating Layer

In some embodiments of the invention, the paste composition is used in conjunction with a substrate, such as a semiconductor substrate, having an insulating layer present on one or more of the substrate's major surfaces. The layer may comprise one or more components selected from aluminum oxide, titanium oxide, silicon nitride, $SiN_x$:H (silicon nitride containing hydrogen for passivation during subsequent firing processing), silicon oxide, and silicon oxide/titanium oxide, and may be in the form of a single, homogeneous layer or multiple sequential sub-layers of any of these materials. Silicon nitride and $SiN_x$:H are widely used.

The insulating layer provides some embodiments of the cell with an anti-reflective property, which lowers the cell's surface reflectance of light incident thereon, thereby improving the cell's utilization of the incident light and increasing the electrical current it can generate. Thus, the insulating layer is often denoted as an anti-reflective coating (ARC). The thickness of the layer preferably is chosen to maximize the anti-reflective property in accordance with the layer material's composition and refractive index. In one approach, the deposition processing conditions are adjusted to vary the stoichiometry of the layer, thereby altering properties such as the refractive index to a desired value. For a silicon nitride layer with a refractive index of about 1.9 to 2.0, a thickness of about 700 to 900 Å (70 to 90 nm) is suitable.

The insulating layer may be deposited on the substrate by methods known in the microelectronics art, such as any form of chemical vapor deposition (CVD) including plasma-enhanced CVD (PECVD) and thermal CVD, thermal oxidation, or sputtering. In another embodiment, the substrate is coated with a liquid material that under thermal treatment decomposes or reacts with the substrate to form the insulating layer. In still another embodiment, the substrate is thermally treated in the presence of an oxygen- or nitrogen-containing atmosphere to form an insulating layer. Alternatively, no insulating layer is specifically applied to the substrate, but a naturally forming substance, such as silicon oxide on a silicon wafer, may function as an insulating layer.

The present method optionally includes the step of forming the insulating layer on the semiconductor substrate prior to the application of the paste composition.

In some implementations of the present process, the paste composition is applied over any insulating layer present on the substrate, whether specifically applied or naturally occurring. The paste's fusible material and any additive present may act in concert to combine with, dissolve, or otherwise penetrate some or all of the thickness of any insulating layer material during firing. Preferably, good electrical contact between the paste composition and the underlying semiconductor substrate is thereby established. Ideally, the firing results in a secure attachment of the conductive metal structure to the substrate, with a metallurgical bond being formed over substantially all the area of the substrate covered by the conductive element. In an embodiment, the conductive metal is separated from the silicon by a nano-scale glass layer (typically of order 5 nm or less) through which the photoelectrons tunnel. In another embodiment, contact is made between the conductive metal and the silicon by a combination of direct metal-to-silicon contact and tunneling through thin glass layers.

The mechanical quality of the attachment of the conductive metal structure to the underlying substrate may be characterized using a pull test. In one implementation, this pull test may be carried out as follows. First, a backing plate made of ceramic or other suitable non-deformable material may be glued to the back side of the substrate to provide stiffness and mechanical reinforcement. A soldering operation is then carried out to attach a solder ribbon to some portion of the conductive metal structure, such as the bus bar. A suitable flux may be applied beforehand and then heat is supplied from the tip of a conventional soldering iron to melt a portion of the solder ribbon and make the attachment. The strength of the bonding of the metallization to the substrate is then determined from the force in a direction normal to the substrate's major surface required to separate the ribbon from the substrate. Such testing is conveniently carried out using a mechanical testing machine, such as one made by the Instron Company (Norwood, Mass.).

Firing also promotes the formation of both good electrical conductivity in the conductive element itself and a low-resistance connection to the substrate, e.g., by sintering the conductive metal particles and etching through the insulating layer. While some embodiments may function with electrical contact that is limited to conductive domains dispersed over the printed area, it is preferred that the contact be uniform over substantially the entire printed area.

Structures

An embodiment of the present invention relates to a structure comprising a substrate and a conductive electrode, which may be formed by the process described above.

Semiconductor Device Manufacture

The structures described herein may be useful in the manufacture of semiconductor devices, including photovoltaic devices. An embodiment of the invention relates to a semiconductor device containing one or more structures described herein. Another embodiment relates to a photovoltaic device containing one or more structures described herein. Still further, there is provided a photovoltaic cell containing one or more structures described herein and a solar panel containing one or more of these structures.

In another aspect, the present invention relates to a device, such as an electrical, electronic, semiconductor, photodiode, or photovoltaic device. Various embodiments of the device include a junction-bearing semiconductor substrate and an insulating layer, such as a silicon nitride layer, present on a first major surface of the substrate.

One possible sequence of steps implementing the present process for manufacture of a photovoltaic cell device is depicted by FIGS. 1A-1F.

FIG. 1A shows a p-type substrate 10, which may be single-crystal, multicrystalline, or polycrystalline silicon. For example, substrate 10 may be obtained by slicing a thin layer from an ingot that has been formed from a pulling or casting process. Surface damage and contamination (from slicing with a wire saw, for example) may be removed by etching away about 10 to 20 μm of the substrate surface using an aqueous alkali solution such as aqueous potassium hydroxide or aqueous sodium hydroxide, or using a mixture of hydrofluoric acid and nitric acid. In addition, the substrate may be washed with a mixture of hydrochloric acid and optional hydrogen peroxide to remove heavy metals such as iron adhering to the substrate surface. Substrate 10 may have a first major surface 12 that is textured to reduce light reflection. Texturing may be produced by etching a major surface with an aqueous alkali solution such as aqueous potassium hydroxide or aqueous sodium hydroxide. Substrate 10 may also be formed from a silicon ribbon.

Figure 1B:
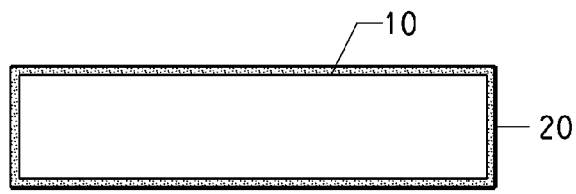

In FIG. 1B, an n-type diffusion layer 20 is formed to create a p-n junction with p-type material below. The n-type diffusion layer 20 can be formed by any suitable doping process, such as thermal diffusion of phosphorus (P) provided from phosphorus oxychloride ($POCl_3$). In the absence of any particular modifications, the n-type diffusion layer 20 is formed over the entire surface of the silicon p-type substrate. The depth of the diffusion layer can be varied by controlling the diffusion temperature and time, and is generally formed in a thickness range of about 0.3 to 0.5 μm. The n-type diffusion layer may have a sheet resistivity from several tens of ohms per square up to about 120 ohms per square.

Figure 1C:

After protecting one surface of the n-type diffusion layer 20 with a resist or the like, the n-type diffusion layer 20 is removed from most surfaces by etching so that it remains only on the first major surface 12 of substrate 10, as shown in FIG. 1C. The resist is then removed using an organic solvent or the like.

Figure 1D:
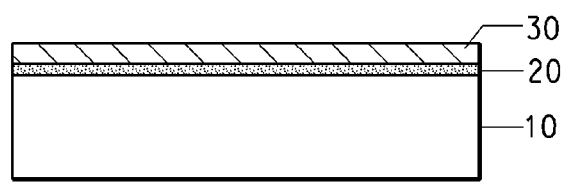

Next, as shown in FIG. 1D, an insulating layer 30, which also functions as an anti-reflective coating, is formed on the n-type diffusion layer 20. The insulating layer is commonly silicon nitride, but can also be a layer of another material, such as $SiN_x$:H (i.e., the insulating layer comprises hydrogen for passivation during subsequent firing processing), titanium oxide, silicon oxide, mixed silicon oxide/titanium oxide, or aluminum oxide. The insulating layer can be in the form of a single layer or multiple layers of the same or different materials.

Figure 1E:
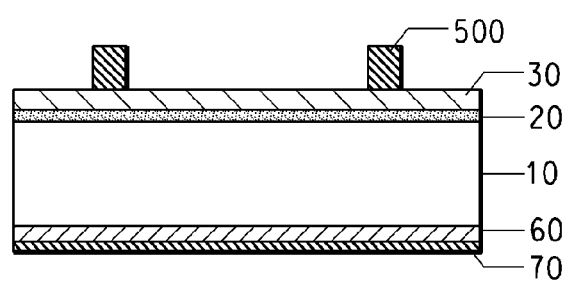

Next, electrodes are formed on both major surfaces 12 and 14 of the substrate. As shown in FIG. 1E, a paste composition 500 of this invention is screen printed on the insulating layer 30 of the first major surface 12 and then dried. For a photovoltaic cell, paste composition 500 is typically applied in a predetermined pattern of conductive lines extending from one or more bus bars that occupy a predetermined portion of the surface. In addition, aluminum paste 60 and back-side silver paste 70 are screen printed onto the back side (the second major surface 14 of the substrate) and successively dried. The screen printing operations may be carried out in any order. For the sake of production efficiency, all these pastes are typically processed by co-firing them at a temperature in the range of about 700° C. to about 975° C. for a period of from several seconds to several tens of minutes in air or an oxygen-containing atmosphere. An infrared-heated belt furnace is conveniently used for high throughput.

Figure 1F:
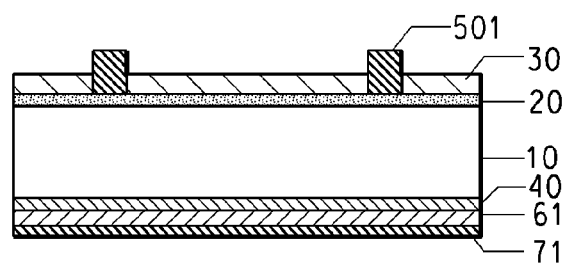

As shown in FIG. 1F, the firing causes the depicted paste composition 500 on the front side to sinter and penetrate through the insulating layer 30, thereby achieving electrical contact with the n-type diffusion layer 20, a condition known as "fire through." This fired-through state, i.e., the extent to which the paste reacts with and passes through the insulating layer 30, depends on the quality and thickness of the insulating layer 30, the composition of the paste, and on the firing conditions. A high-quality fired-through state is believed to be an important factor in obtaining high conversion efficiency in a photovoltaic cell. Firing thus converts paste 500 into electrode 501, as shown in FIG. 1F.

The firing further causes aluminum to diffuse from the back-side aluminum paste into the silicon substrate, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. During firing, the boundary between the back-side aluminum and the back-side silver assumes the state of an alloy, thereby achieving electrical connection. Most areas of the back electrode are occupied by the aluminum electrode, owing in part to the need to form a p+ layer 40. Since there is no need for incoming light to penetrate the back side, substantially the entire surface may be covered. At the same time, because soldering to an aluminum electrode is unfeasible, a silver or silver/aluminum back electrode is formed on limited areas of the back side as an electrode to permit soldered attachment of interconnecting copper ribbons or the like.

While the present invention is not limited by any particular theory of operation, it is believed that, upon firing, the fusible material, with any additive component present acting in concert, promotes etching and rapid digestion of the insulating layer conventionally used on the front side of a photovoltaic cell. Efficient etching in turn permits the formation of a low resistance, front-side electrical contact between the metal(s) of the composition and the underlying substrate.

It will be understood that the present paste composition and process may also be used to form electrodes, including a front-side electrode, of a photovoltaic cell in which the p- and n-type layers are reversed from the construction shown in FIGS. 1A-1F, so that the substrate is n-type and a p-type material is formed on the front side.

In yet another embodiment, this invention provides a semiconductor device that comprises a semiconductor substrate having a first major surface; an insulating layer optionally present on the first major surface of the substrate; and, disposed on the first major surface, a conductive electrode pattern having a preselected configuration and formed by firing a paste composition as described above.

A semiconductor device fabricated as described above may be incorporated into a photovoltaic cell. In another embodiment, this invention thus provides a photovoltaic cell array that includes a plurality of the semiconductor devices as described, and made as described, herein.

EXAMPLES

The operation and effects of certain embodiments of the present invention may be more fully appreciated from a series of examples (Examples 1-8), as described below. The embodiments on which these examples are based are representative only, and the selection of those embodiments to illustrate aspects of the invention does not indicate that materials, components, reactants, conditions, techniques and/or configurations not described in the examples are not suitable for use herein, or that subject matter not described in the examples is excluded from the scope of the appended claims and equivalents thereof.

Examples 1-6

Paste Preparation

Each of the fusible material compositions set forth in Table I was prepared by melting the requisite ingredients in a covered Pt crucible that was heated in air from room temperature to 1100° C. (Examples 1-3 and 6) or 1200° C. (Examples 4-5) over a period of 1.5 hours, and held at the respective temperature for 1 hour. Each melt was separately poured onto the flat surface of a cylindrically-shaped stainless steel block (8 cm high, 10 cm in diameter). The cooled, yellow- or amber-colored buttons were pulverized to −100 mesh frit.

Then the frit was ball milled in a polyethylene container with zirconia media and a suitable liquid, such as water, isopropyl alcohol, or water containing 0.5 wt % TRITON™ X-100 octylphenol ethoxylate surfactant (available from Dow Chemical Company, Midland, Mich.) until the $d_{50}$ was in the range of 0.5 to 0.7 μm.

TABLE I

Fusible Material Compositions

| Example | Composition (wt. %) | | | | | | |
|---|---|---|---|---|---|---|---|
| | $Bi_2O_3$ | $SiO_2$ | $B_2O_3$ | $Al_2O_3$ | $Li_2O$ | $Na_2O$ | $BiF_3$ |
| 1 | 84.08 | 6.54 | 2.88 | 6.50 | 0 | 0 | 0 |
| 2 | 82.73 | 6.44 | 2.84 | 8.00 | 0 | 0 | 0 |
| 3 | 80.92 | 6.30 | 2.78 | 10.00 | 0 | 0 | 0 |
| 4 | 78.68 | 6.12 | 2.70 | 12.50 | 0 | 0 | 0 |
| 5 | 76.43 | 5.95 | 2.62 | 15.00 | 0 | 0 | 0 |
| 6 | 79.68 | 3.68 | 3.41 | 9.03 | 0.57 | 1.19 | 2.43 |

In accordance with an aspect of the invention, the fusible materials of Examples 1 to 6 were formulated in paste compositions suitable for screen printing. The pastes, before adjusting their viscosities with additional solvent, consisted of approximately 9.7 wt. % vehicle and 2 to 5 wt. % fusible material, with the remainder being silver powder. Examples 1 to 5 used 2 wt. % fusible material in the paste, and Example 6 used 5 wt. %.

The organic vehicle was prepared as a master batch using a Thinky mixer (available from Thinky USA, Inc., Laguna Hills, Calif.) to mix the ingredients listed in Table II below, with percentages given by weight.

TABLE II

Organic Vehicle Composition

| Ingredient | Trade Name | wt. % |
|---|---|---|
| 11% ethyl cellulose (50-52% ethoxyl) dissolved in TEXANOL ™ solvent | | 13.98% |
| 8% ethyl cellulose (48-50% ethoxyl) dissolved in TEXANOL ™ solvent | | 5.38% |
| tallowpropylenediamine dioleate | DUOMEEN ® TDO | 10.75% |
| Pentaerythritol ester of hydrogenated rosin* | FORALYN ™ 110 | 26.88% |
| Hydrogenated castor oil derivative | THIXATROL ® ST | 5.38% |
| Dibasic ester | DBE-3 | 37.63% |

The organic materials used were: ethyl cellulose (Ashland Chemical Co., Covington, Ky.); DUOMEEN® TDO (Akzo Nobel Surface Chemistry, Chicago, Ill.); FORALYN™ 110 (Eastman Chemical Co., Kingsport, Tenn.); THIXATROL® ST (Elementis, Hightstown, N.J.); DBE-3 (Invista, Wilmington, Del.); and TEXANOL™ ester alcohol (Eastman Chemical Co., Kingsport, Tenn.). Two grades of ethyl cellulose having different viscosities, resulting from different average molecular weights, were combined. The first grade was specified by the manufacturer as having a nominal viscosity of about 80 to 105 Pa-s, and the second grade had nominal viscosity of about 8 to 11 Pa-s, with each viscosity determined as that of a 5% solution of the ethyl cellulose in an 80/20 mixture of toluene/ethanol. The amount of each grade and the TEXANOL™ solvent dilution used were adjusted to obtain a vehicle ultimately affording a viscosity suitable for screen printing. In each case, a suitable small portion of TEXANOL™ was added at the end to adjust the final viscosity to a level permitting the composition to be screen printed onto a substrate. Typically, a final paste composition having a viscosity of about 300 Pa-s was found to yield good screen printing results, but some variation, for example ±50 Pa-s or more would be acceptable, depending on the precise printing parameters.

Silver powder, represented by the manufacturer as having a predominantly spherical shape and having a particle size distribution with a $d_{90}$ of 3.8 μm as measured in an isopropyl alcohol dispersion using a Horiba LA-910 analyzer, was combined with the milled frit in a glass jar and tumble mixed for 15 minutes. The inorganic mixture was then added by thirds to a Thinky jar containing the organic ingredients and Thinky-mixed for 1 minute at 2000 RPM after each addition. The paste was cooled and the viscosity was adjusted to between about 300 and 400 Pa-s by adding solvent and Thinky mixing for 1 minute at 2000 RPM. This step was repeated until the correct viscosity was achieved. The paste was then milled on a three-roll mill (Charles Ross and Son, Hauppauge, N.Y.) with a 25 μm gap for 3 passes at zero pressure and 3 passes at 100 psi (689 kPa).

The degree of dispersion of each paste composition was measured using commercial fineness of grind (FOG) gauges (Precision Gage and Tool, Dayton, Ohio) in accordance with ASTM Standard Test Method D 1210-05, which is promulgated by ASTM International, West Conshohocken, Pa., and is incorporated herein by reference. The FOG values in Table III are specified as X/Y, meaning that the size of the largest particle detected is X μm and the median size is Y μm.

TABLE III

FOG Values of Paste Compositions

| Example | FOG Value (μm/μm) |
|---|---|
| 1 | 9/3 |
| 2 | 2/1 |
| 3 | 7/3 |
| 4 | 2/0 |
| 5 | 2/1 |
| 6 | 4/2 |

Each paste composition was allowed to sit for 24 hours, then its viscosity was adjusted to be between 175 and 300 Pa-s, to render it suitable for screen printing. The viscometer was a Brookfield viscometer (Brookfield Inc., Middleboro, Mass.) with a #14 spindle and a #6 cup. Viscosity values were taken after 3 minutes at 10 RPM.

Example 7

Photovoltaic Cell Fabrication

Photovoltaic cells in accordance with an aspect of the invention were made using the paste compositions of Examples 1 to 6 to form the front-side electrodes.

For convenience, the fabrication and electrical testing were carried out using 28 mm×28 mm "cut down" wafers prepared by dicing 156 mm×156 mm starting wafers using a diamond wafering saw. The test wafers (Deutsche Cell, 200 μm thick, 65 ohms per square) were screen printed using an AMI-Presco (AMI, North Branch, N.J.) MSP-485 screen printer, first to form a full ground plane back-side conductor using a conventional Al-containing paste, SOLAMET® PV381 (available from DuPont, Wilmington, Del.), and thereafter to form a bus bar and eleven conductor lines at a 0.254 cm pitch on the front surface using the various exemplary paste compositions herein. After printing and drying, cells were fired in a BTU rapid thermal processing, multi-zone belt furnace (BTU International, North Billerica, Mass.). The firing temperatures reported in the examples are the furnace set point temperatures for the hottest furnace zone. This temperature was found to be approximately 125° C. greater than the wafer temperature actually attained during the cell's passage through the furnace. 25 cells were printed using each paste; 5 cells were fired at each setpoint temperature in a 5-temperature ladder. After firing, the median conductor line width was 120 μm and the mean line height was 15 μm. The bus bar was 1.25 mm wide. The median line resistivity was 3.0 μΩ-cm. Performance of "cut-down" 28 mm×28 mm cells is known to be impacted by edge effects which reduce the overall photovoltaic cell efficiency by ~5% from what would be obtained with full-size wafers.

Example 8

Photovoltaic Cell Testing

Electrical properties of photovoltaic cells fabricated as set forth in Example 6 were measured at 25±1.0° C. using an ST-1000 IV tester (Telecom STV Co., Moscow, Russia). The Xe arc lamp in the IV tester simulated sunlight with a known intensity and irradiated the front surface of the cell. The tester used a four contact method to measure current (I) and voltage (V) at approximately 400 load resistance settings to determine the cell's I-V curve. Efficiency was calculated from the I-V curve for each cell. Mean and median efficiency was calculated for the five cells of each test condition. This testing protocol is exemplary. Other equipment and procedures for testing efficiencies will be recognized by one of ordinary skill in the art.

Data shown in Table IV indicate the highest measured mean efficiency for the five cells of each test group, and the firing temperature at which each value was obtained.

TABLE IV

Electrical Performance of Photovoltaic Cells

| Example | Firing Temp. (° C.) | Mean Efficiency (%) |
| --- | --- | --- |
| 1 | 930 | 14.55 |
| 2 | 925 | 15.00 |
| 3 | 955 | 15.31 |
| 4 | 955 | 14.99 |
| 5 | 940 | 15.57 |
| 6 | 920 | 15.48 |

The data of Table IV demonstrate that the present high-alumina paste composition can be used to manufacture photocells having excellent electrical properties, including high efficiency.

Having thus described the invention in rather full detail, it will be understood that this detail need not be strictly adhered to but that further changes and modifications may suggest themselves to one skilled in the art, all falling within the scope of the invention as defined by the subjoined claims

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range In this specification, unless explicitly stated otherwise or indicated to the contrary by the context of usage, (a) amounts, sizes, ranges, formulations, parameters, and other quantities and characteristics recited herein, particularly when modified by the term "about", may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value; and (b) all numerical quantities of parts, percentage, or ratio are given as parts, percentage, or ratio by weight; the stated parts, percentage, or ratio by weight may or may not add up to 100.

What is claimed is:

1. A paste composition comprising in admixture:
  (a) a source of electrically conductive metal;
  (b) a fusible material comprising:
    50-90 wt. % $Bi_2O_3$,
    8-15 wt. % $Al_2O_3$,
    2-26 wt. % $SiO_2$,
    0-9 wt. % $B_2O_3$, and
    wherein the weight percentages are based on the total fusible material, and wherein some or all of at least one of the oxides is optionally replaced by a fluoride of the same cation in an amount such that the fusible material comprises at most 5 wt. % of fluorine, based on the total fusible material; and (c) an organic vehicle, and wherein the paste composition is lead-free.

2. The paste composition of claim 1, wherein the fusible material comprises:

60-90 wt. % $Bi_2O_3$,
8-12.5 wt. % $Al_2O_3$,
2-19 wt. % $SiO_2$, and
0.5-7 wt. % $B_2O_3$.

3. The paste composition of claim 1, wherein the fusible material comprises:

70-90 wt. % $Bi_2O_3$,
8-10 wt. % $Al_2O_3$,
2-12 wt. % $SiO_2$, and
1-5 wt. % $B_2O_3$.

4. The paste composition of any of claims 1 to 3, wherein the fusible material further comprises at least one of:

0-6 wt. % ZnO,
0-3 wt. % $P_2O_5$,
0-5 wt. % $Li_2O$,
0-5 wt. % $Na_2O$,
0-2 wt. % $TiO_2$, or
0-2 wt. % $ZrO_2$.

5. The paste composition of claim 1, wherein the fusible material comprises 0-2 wt. % $Li_2O$, 0-3 wt. % $Na_2O$, and 0.5-4 wt. % F, with the proviso that the total amount of $Li_2O$ and $Na_2O$ present is at least 0.5 wt. %.

6. The paste composition of claim 1, wherein the fusible material consists essentially of:

71-90 wt. % $Bi_2O_3$,
8-11 wt. % $Al_2O_3$,
2-13 wt. % $SiO_2$, and
1-5 wt. % $B_2O_3$.

7. The paste composition of claim 1, wherein the paste composition is zinc-free.

8. The paste composition of claim 1, wherein the fusible material comprises 0.5 to 10 wt. % of the total paste composition.

9. The paste composition of claim 1, wherein the source of the electrically conductive metal is an electrically conductive metal powder.

10. The paste composition of claim 1, wherein the electrically conductive metal comprises Ag.

11. The paste composition of claim 10, wherein the Ag comprises 75 to 99.5 wt. % of the solids in the composition.

12. A paste composition comprising in admixture:

(a) a source of electrically conductive metal;
(b) a fusible material comprising:

50-90 wt. % $Bi_2O_3$,
6.5-15 wt. % $Al_2O_3$,
2-8 wt. % $SiO_2$,
0.5-9 wt. % $B_2O_3$, and wherein the weight percentages are based on the total fusible material, and wherein some or all of at least one of the oxides is optionally replaced by a fluoride of the same cation in an amount such that the fusible material comprises at most 5 wt. % of fluorine, based on the total fusible material; and (c) an organic vehicle, and wherein the paste composition is lead-free.

13. The paste composition of claim 12, wherein the fusible material is substantially free of Ni.

14. The paste composition of claim 12, wherein the fusible material is substantially free of Zn.

* * * * *